US011189458B2

(12) United States Patent
Perea et al.

(10) Patent No.: US 11,189,458 B2
(45) Date of Patent: Nov. 30, 2021

(54) CRYO NANOMANIPULATOR PROBE WITH INTEGRATED GAS INJECTION

(71) Applicant: Battelle Memorial Institute, Richland, WA (US)

(72) Inventors: Daniel E. Perea, Kennewick, WA (US); James E. Evans, Richland, WA (US); Jeffrey Ditto, Lake Oswego, OR (US)

(73) Assignee: Battelle Memorial Institute, Richland, WA (US)

(*) Notice: Subject to any disclaimer, the term of this patent is extended or adjusted under 35 U.S.C. 154(b) by 0 days.

(21) Appl. No.: 16/748,705

(22) Filed: Jan. 21, 2020

(65) Prior Publication Data

US 2021/0225610 A1 Jul. 22, 2021

(51) Int. Cl.
*H01J 37/28* (2006.01)

(52) U.S. Cl.
CPC ......... *H01J 37/28* (2013.01); *H01J 2237/006* (2013.01)

(58) Field of Classification Search
CPC .. H01J 37/00; H01J 37/02; H01J 37/20; H01J 37/26; H01J 37/261; H01J 37/28; H01J 2237/006
USPC ................ 250/306, 307, 310, 311
See application file for complete search history.

(56) References Cited

U.S. PATENT DOCUMENTS

| 8,729,469 B1 | 5/2014 | Schmidt et al. |
| 8,796,646 B2 | 8/2014 | Mulders et al. |
| 10,475,620 B2 | 11/2019 | Peto |
| 2005/0103272 A1* | 5/2005 | Koops ................. H01J 37/3056 118/723 EB |
| 2013/0037706 A1* | 2/2013 | Ditto ...................... H01J 37/20 250/282 |
| 2013/0037713 A1 | 2/2013 | Hartfield et al. |
| 2016/0118216 A1* | 4/2016 | Doemer ................ H01J 37/023 250/307 |

* cited by examiner

*Primary Examiner* — Jason L McCormack
(74) *Attorney, Agent, or Firm* — Klarquist Sparkman, LLP

(57) ABSTRACT

A probe assembly for use with a charged particle instrument includes an elongate body having a proximal end for positioning outside of a charged particle instrument enclosed environment, a distal end for positioning within the enclosed environment and a longitudinal axis. A port interface is located on the body between the proximal and distal ends, and is coupleable to a nanomanipulator system of the charged particle instrument. A probe needle is positioned at a distal end of the body and is selectively positionable from outside the enclosed environment to contact a specimen within the enclosed environment. At least one gas injection needle is adjustably positioned near the probe needle. The gas injection needle is connectable to a source of pressurized gas to selectively inject gas in the area of the probe needle within the enclosed environment.

16 Claims, 7 Drawing Sheets

CRYO NANOMANIPULATOR PROBE WITH INTEGRATED GAS INJECTION

ACKNOWLEDGMENT OF GOVERNMENT SUPPORT

This invention was made with Government support under Contract DE-AC05-76RL01830 awarded by the U.S. Department of Energy. The Government has certain rights in the invention.

FIELD

This application relates to methods and apparatus for processing a microscopic specimen, and particularly within a charged particle instrument such as a focused ion-beam (FIB) microscope, a scanning transmission electron beam microscope (STEM) or a scanning electron microscope (SEM).

BACKGROUND

Charged particle microscope instruments are used to prepare specimens in a variety of fields, including semiconductor materials. Beam-induced deposition, including electron-beam induced deposition (EBID) and ion beam-induced deposition (IBID), can be carried out within charged particle instrument environments to deposit a material on a surface of a substrate, such as a substrate made of silicon or another material. The charged particle beam is directed toward the substrate in the presence of a deposition gas. A layer of material decomposed from the deposition gas is deposited on the substrate, and by-products of the process are pumped away using a vacuum system for the instrument.

Beam-induced deposition at cryogenic temperatures, such as below −50° C. or below −130° C., requires specific techniques because the types of gases useful for deposition at higher temperatures fail to work at cryogenic temperatures. One deposition gas suitable for use at cryogenic temperatures is propane. The dedicated GIS (gas injection system) for a charged particle instrument is typically configured to inject a gas other than propane (e.g. naphthalene).

A nanomanipulator is a tool used within a charged particle environment to interact with specimens. The nanomanipulator is typically part of a probe system that is inserted into the environment through a port in an enclosure defining the environment. The nanomanipulator typically has a probe needle capable of being controllably moved from outside the enclosure to interact with the specimen, such as to perform a lift-out operation and/or otherwise manipulate the specimen.

To provide gas injection capability for use at cryogenic temperatures in a conventional charge particle instrument would thus require modifying the existing GIS to substitute or add a gas compatible for use at cryogenic temperatures, which is expensive and limits the usefulness of the instrument, or to use another port to add a second GIS, but open ports are often unavailable and a second GIS adds unnecessary costs.

SUMMARY

Described below are embodiments of a probe assembly and related methods in which gas injection is provided near the probe needle and substrate, and can be adjustably positioned to help facilitate deposition onto the substrate, particularly at cryogenic conditions.

According to one implementation, a probe assembly for use with a charged particle instrument includes an elongate body having a proximal end for positioning outside of a charged particle instrument enclosed environment, a distal end for positioning within the enclosed environment and a longitudinal axis. The probe assembly has a port interface located on the body between the proximal and distal ends, and is coupleable to a nanomanipulator system of the charged particle instrument. A probe needle is positioned at a distal end of the body. The probe needle is selectively positionable from outside the enclosed environment to contact a specimen within the enclosed environment. At least one gas injection needle extends through a tubular section of the elongate body and is adjustably positioned near to the probe needle. The at least one gas injection needle is connectable to a source of pressurized gas to selectively inject gas in the area of the probe needle within the enclosed environment.

In some implementations, the at least one gas injection needle is positioned within 0.5 mm to 5 mm of the probe needle. In some implementations, there are first and second gas injection needles having opposed distal ends that are adjustably positioned within close proximity of the probe needle, proximal ends for connection to one or more sources of pressurized gas and portions extending through the tubular section of the elongate body. The first and second gas injection needles can be individually controllable to selectively inject gas in the area of the probe needle.

In some implementations, the assembly includes at least one needle receiving member that is selectively movable to reposition a distal end of the gas injection needle relative to the probe needle. In some implementations, at least first and second needle receiving members are selectively movable to reposition the respective distal ends of the first and second gas injection needles relative to the probe needle.

In some implementations, the assembly includes a positioning member that supports the first and second needle receiving members. The positioning member can be movable in a first transverse direction extending transverse to the longitudinal axis to move the at least two needle receiving members in tandem relative to the probe needle. In some implementations, the needle receiving members are separately movable relative to the probe needle in a second transverse direction perpendicular to the longitudinal axis and to the first transverse direction to reposition the respective distal ends of gas injection needles relative to the needle probe and to each other.

In some implementations, the body comprises a temperature sensor positioned to sense an approximate temperature of the probe needle during operation in the enclosed environment. In some implementations, the body comprises a needle support to which the probe needle is removably coupled, a first tube coupled to the needle support and extending proximally, a spacer coupled to the first tube and extending proximally, and a second tube coupled to the spacer and extending proximally, and the assembly includes at least one temperature sensor positioned adjacent a location where the first tube and the needle support are coupled together and having one or more signal lines extending proximally through the first tube. In some implementations, the temperature sensor includes a thermocouple with thermocouple wires that are hermetically sealed in place near a proximal end of the probe assembly, and the needle support has a recess shaped to receive the distal end of the first tube.

In some implementations, the spacer can have at least two passages that are opposed to each other, and the passages can be configured to receive the first and second gas injection needles from the second tube and to support the exposed distal ends of the first and second gas injection needles in positions spaced away from each other, the needle support and the probe needle.

In some implementations, the needle support has a connection for a wire braid connection to a source of cryogenic cooling for keeping the probe needle at cryogenic temperatures.

In some implementations, the assembly includes a sheath configured to slide over the gas injection needles and a distal end of the body to constrain the gas injection needles for inserting the body into the instrument.

According to a method implementation, a method of using a port-mounted nanomanipulator system in a charged particle instrument includes providing a combined probe and gas injection assembly, the assembly having an elongate body, a proximal end, a distal end with a probe needle and a port interface positioned between the distal end and the proximal end, wherein the elongate body comprises a tubular section, coupling the port interface on the elongate body to a port of the system, wherein a portion of the probe extending distally from the port interface is within an enclosed instrument environment and connecting the proximal end to a source of pressurized gas to allow gas to be selectively injected through a gas injection needle extending within the tubular section into the instrument environment near the probe needle.

The foregoing and other objects, features, and advantages will become more apparent from the following detailed description, which proceeds with reference to the accompanying figures.

DETAILED DESCRIPTION

Described below are implementations of a probe assembly for use with a charged particle instrument, and typically with a nanomanipulator system mounted in a port of the charged particle instrument, that provides integrated gas injection near the probe's needle. Because the gas injection is integrated within the probe assembly, there is no need to consume a second open port of the instrument to provide for gas injection, which is beneficial because there are many competing needs to fulfill among a limited number of open ports. The probe assembly is suited for use at cryogenic temperatures, but also functions at non-cryogenic temperatures as well.

Figure 1:
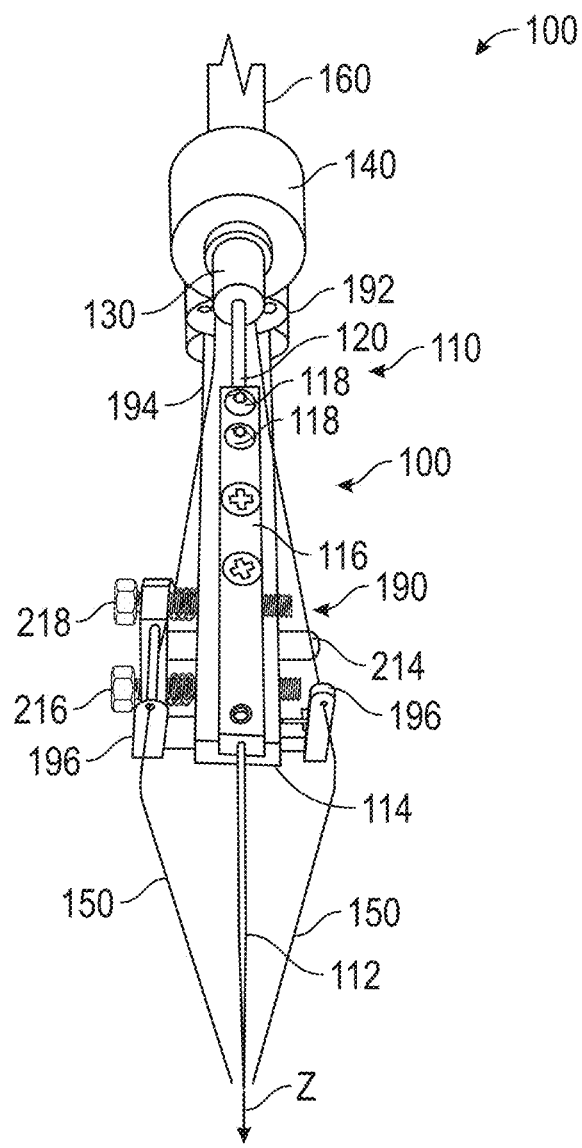
FIG. 1 is a perspective view of a distal portion of a probe assembly with integrated gas injection, showing upper and side surfaces thereof.
Figure 2:
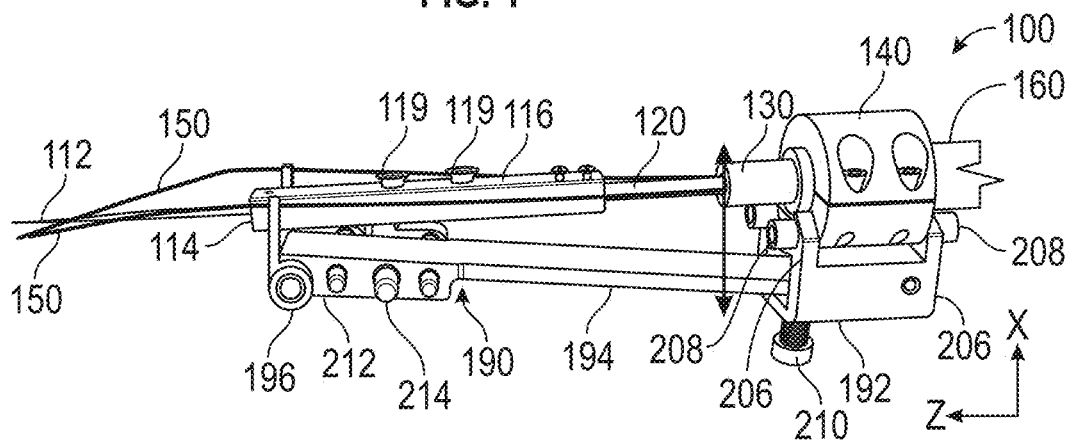
FIG. 2 is a side elevation view of the portion of the probe assembly of FIG. 1, showing adjustability in a first direction.
Figure 3:
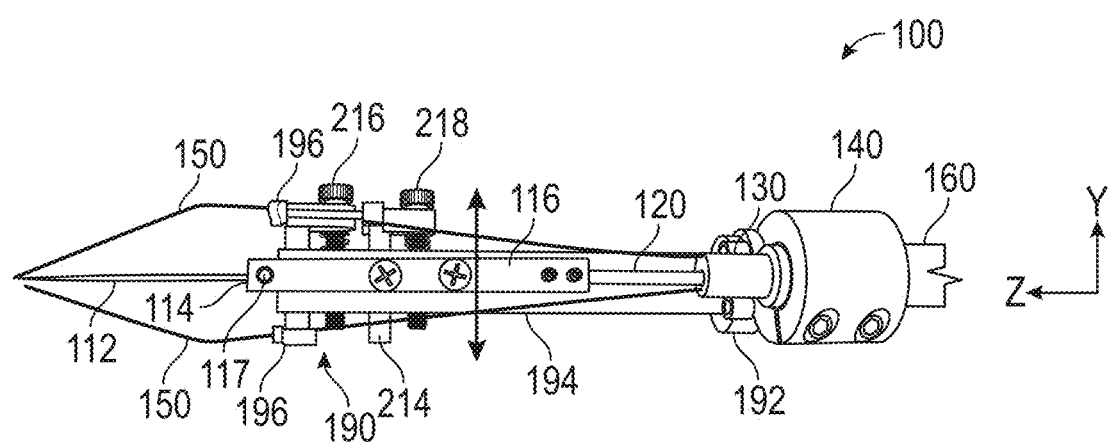
FIG. 3 is a top plan view of the portion of the probe assembly of FIG. 1, showing adjustability in a second direction.

Referring to FIGS. 1-6, one implementation of a probe assembly 100 with integrated gas injection is shown. The probe assembly 100 has a body 110 extending along a longitudinal axis, which is defined as the Z direction. As best shown in FIGS. 1-3, a probe needle 112 (also referred to as a nanomanipulator probe) is positioned at a distal end of the probe assembly 100.

The probe needle 112 extends from a distal end 114 of a needle support 116. The probe needle 112 can be removably secured to the needle support 116, e.g., with a set screw 117 (FIG. 3), to allow for the probe needle 112 to be replaced or adjusted as necessary. A proximal end of the needle support 116 is coupled to a first tube 120. In the illustrated implementation, an end of the first tube 120 is received in a recess (hidden from view in the figures) formed in the needle support 116 and secured with set screws 118. The first tube 120 extends proximally through a spacer 130. The spacer 130 serves to keep one or more gas injection needles 150, a pair of which are shown in the figures, in a spaced apart relation, as is described below in greater detail.

Figure 4A:
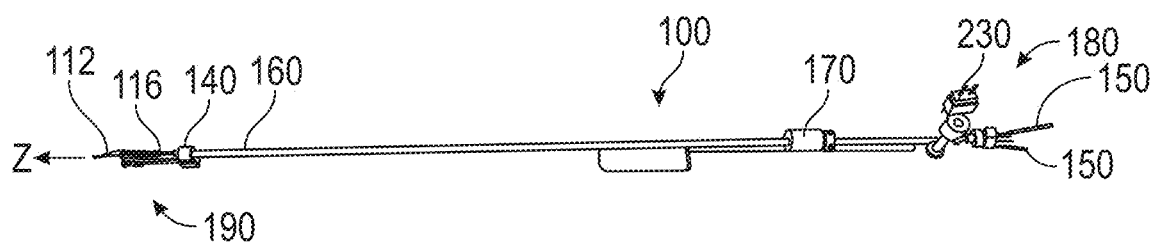
FIG. 4A is a side elevation view of the probe assembly showing its full length between the distal end and a proximal end.

At a proximal end of the spacer 130, a second tube 160 is joined, and a fitting 140 is positioned over the second tube 160. The gas injection needles 150 extend proximally, from their exposed portions, through the spacer 130 (see FIG. 5), and through the second tube 160. FIG. 4A shows the proximal ends of the gas injection needles 150 protruding from the second tube 160 at a proximal end 180 of the probe assembly 100. In use, the gas injection needles 150 are connected to one or more sources of pressurized gas and corresponding regulating device(s), as described in further detail below.

As shown in FIG. 4A, between the fitting 140 and the proximal end 180, the probe assembly 100 has a port interface 170. The port interface 170 is configured to allow the probe assembly 100 to be removably secured in a conventional port-mounted nanomanipulator system (not shown), such as the OmniProbe 200 nanomanipulator from Oxford Instruments. In operation, the portion of the probe assembly 100 extending distally from the port interface 170 is subjected to the vacuum operating environment, whereas the portion extending proximally from the port interface 170 is located in the ambient environment.

In addition to providing for gas injection integrated at the same location (same axis) as the probe, the probe assembly 100 in the illustrated implementation includes a positioning assembly 190. The positioning assembly 190 allows the position of one or more of the injection needles 150 to be adjusted as desired. In general, the gas injection needles 150 have their distal ends positioned close to the distal end of the probe needle 112, as shown in the figures, but the precise positions can be adjusted as described below to achieve desired effects. For example, in some implementations, a distance between the gas injection needle 150 and the probe needle 112 is 0.5-5 mm, or 1-3 mm. In the illustrated implementation, there are two gas injection needles 150, but the same principles can be applied to implementations with one injection needle or more than two gas injection needles.

The positioning assembly 190 can provide for adjusting the position of the gas injection needles in the X direction (also referred to as the horizontal direction) as shown in FIG. 2. In the illustrated implementation, the positioning assembly 190 is coupled to a suitable location on the probe body 110, e.g., at the fitting 140 as shown, by an attachment 192, and has a support member 194 adjustably cantilevered relative to the attachment 192 with needle receiving members 196 at its distal end. The attachment 192 can have one or more flanges 206 at its ends that can be attached to the fitting 140 with threaded fasteners 208.

The support member 194 can be moved, that is inclined or declined relative to the longitudinal axis, e.g., by rotating an adjustment screw 210, which in turn moves the needle receiving members 196 and the gas injection needles 150 received therein relative to the probe needle 112 in the X direction (see also the arrows shown in FIG. 2). In the illustrated implementation, the two needles 150 are moved in the X direction in tandem, but it is also possible to configure the assembly for individual needle movement in the X direction.

The positioning assembly 190 also allows the gas injection needles 150 to be positioned in the Y direction (also referred to as the lateral direction), which is best shown in FIGS. 1 and 3. In the illustrated implementation, each of the gas injection needles 150 is individually repositionable in the Y direction relative to the longitudinal axis, e.g., by rotating one or more of the adjustment screws 216, 218 that are threaded into an adjustment piece 212 of the support member 194, which in turn move the needle receiving members 196 and the gas injection needles 150. A guide pin 214 keeps the assembly aligned during movement.

As examples of achieving selected gas injection for a desired effect on the specimen, a single gas injection needle 150, if provided, or one of the multiple gas injection needles 150, can be used on its own to inject gas only from one side of the probe needle 112, i.e., from one side of the longitudinal axis. Alternatively, multiple gas injection needles 150 can be used simultaneously to inject gas in the area of the probe needle 112 from opposite sides of the longitudinal axis.

Also, one of the gas injection needles 150 can be positioned closer to the longitudinal axis than the others, such as in the Y direction. Further, the gas injection needles 150 can moved in tandem, such as in the X direction, to change the direction at which gas is injected relative to the probe needle 112 and specimen.

The needle support 116 can include a connection for connecting the probe assembly 100, and particularly the probe needle 112, to a cryogenic cooling source. In the illustrated implementation, the connection comprises threaded fasteners 119 (FIG. 2) for connecting one end of a copper braid (not shown) which has its opposite end connected to the cryogenic cooling source.

Figure 5:
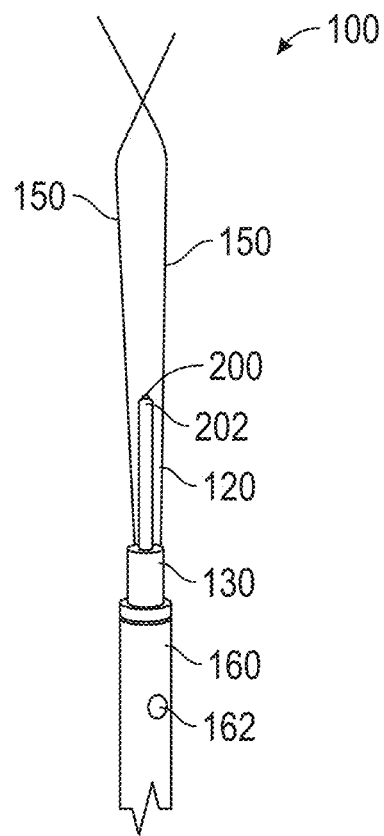
FIG. 5 is a perspective view of the distal portion of the probe assembly, with some components removed, showing proximal ends of two gas injection needles protruding from the body of the probe assembly.

To install the probe assembly 100 into a suitable port, the fitting 140 is removed to decouple the positioning assembly 190 from the probe assembly 100. The needle support 116 is removed from the first tube 120. Thus, the probe assembly is configured approximately as shown in FIG. 5. As also shown in FIG. 5, the second tube 160 can have a vent opening 162 that allows the tube 160 to be evacuated up to its hermetically sealed end at the proximal end 180 of the probe assembly 230

Figure 6:
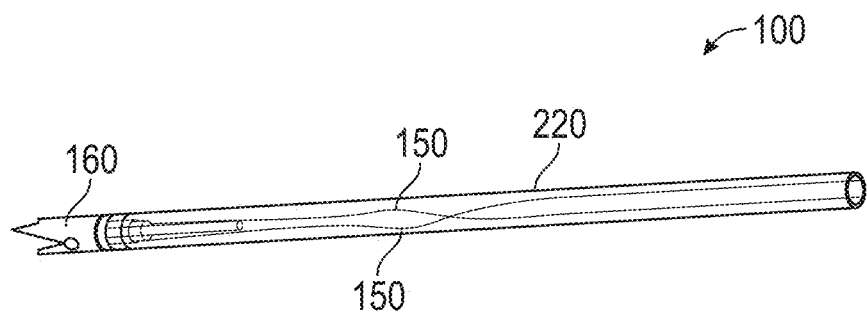
FIG. 6 is a perspective view similar to FIG. 5, except showing sheath installed over the gas injection needles.

To protect the gas injection needles, a sheath is fitted 220 is fitted over the needles and over the exposed portion of the spacer 130 as shown in FIG. 6. The outer diameters of the second tube 160 and the sheath 220 are configured to be the same or less than the corresponding structure of a conventional nanomanipulator probe so that the assembly can be inserted through a conventional opening in a conventional port-mounted nanomanipulator system.

In the illustrated implementation, following insertion through the port, the sheath 220 is then removed and the needle support 116 is installed on the first tube 120. The fitting 140, with the support member 194, needle receiving members 196 and other components, is installed over the second tube 160. The gas injection needles 150 are guided through the respective needle receiving members 196. The positioning system 190 is used to adjust the position(s) of the gas injection needles 150 as desired before the environment is placed under vacuum. One or more of these steps can be assisted with a camera within the environment having a view of the probe needle 112, specimen and gas injection needles 150.

Figure 4B:
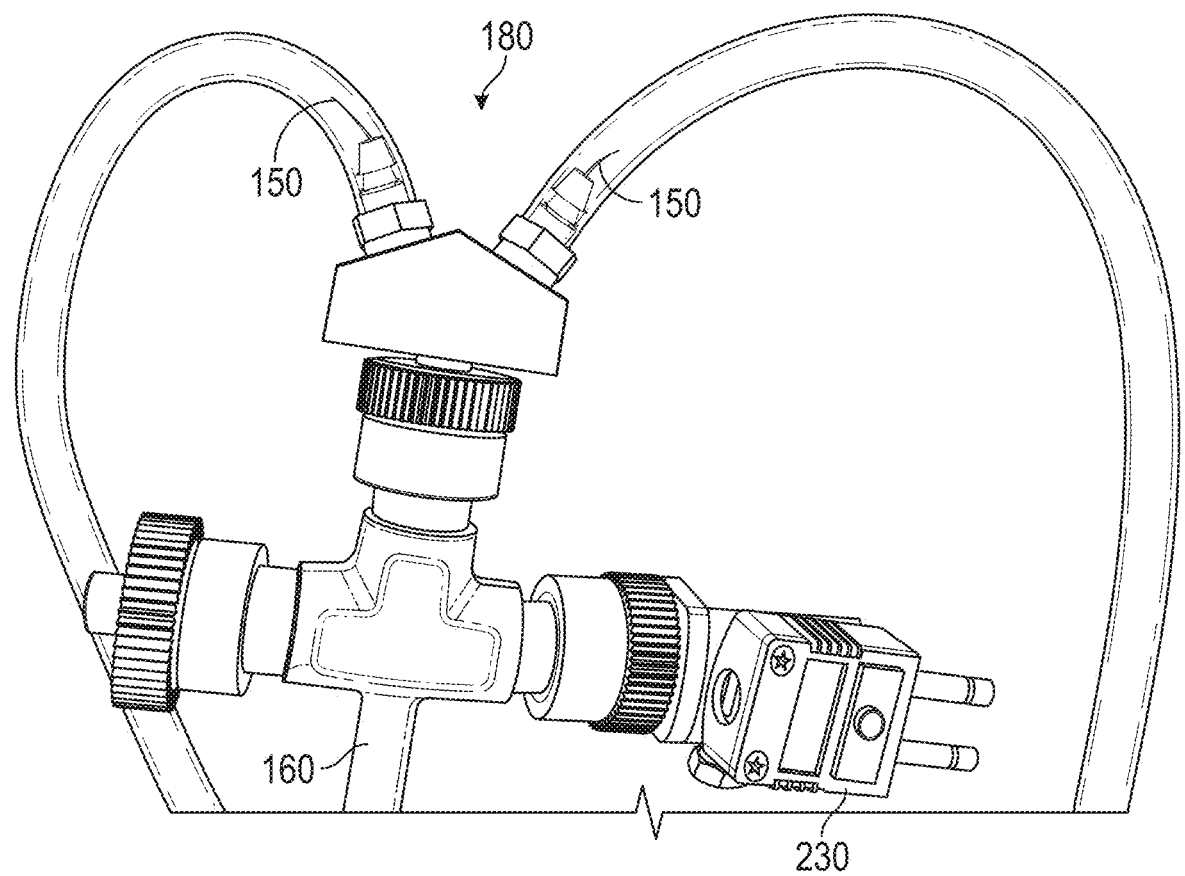
FIG. 4B is an enlarged view of a proximal end of the probe assembly.

Referring again to FIG. 5, the probe assembly 100 can be fitted with a temperature sensor, such as a thermocouple 200. As shown in FIG. 5, the thermocouple 200 can be positioned at a distal end 202 of the first tube 120. Specifically, the joined wires of the thermocouple 200 can be encased in epoxy or otherwise hermetically sealed in place at the distal end 202. Thus, when the needle support 116 is connected with the first tube 120 inserted into the recess, the thermocouple 200 is positioned in contact with the body of the needle support 116. The needle support 116 is desirably formed of a high thermal conductivity material, such as copper, and thus the thermocouple 200 experiences a temperature very close to that of the probe needle 112 attached to the needle support 116. In implementations of the probe assembly intended for use at cryogenic temperatures, a Type T thermocouple can be used. The wires of the thermocouple 200 extend proximally toward the proximal end 180, where they are terminated at a thermocouple plug connection 230, as shown in FIGS. 4A and 4B. As best shown in FIG. 4B, which is an enlarged view, the thermocouple plug connection 230 is attached to a custom mount that attaches to a threaded connection extending from the second tube 160 as shown. The thermocouple wires are hermetically sealed, such as with epoxy.

As also shown in FIG. 4B, the proximal ends of the gas injection needles 150 extend through fittings that are shown connected with clear tubing sections that leading to gas supplies (not shown) to supply the gas injection needles 150 with selected gases. The gas injection needles are hermetically sealed, such as with epoxy, in the area of the fittings.

Figure 7:
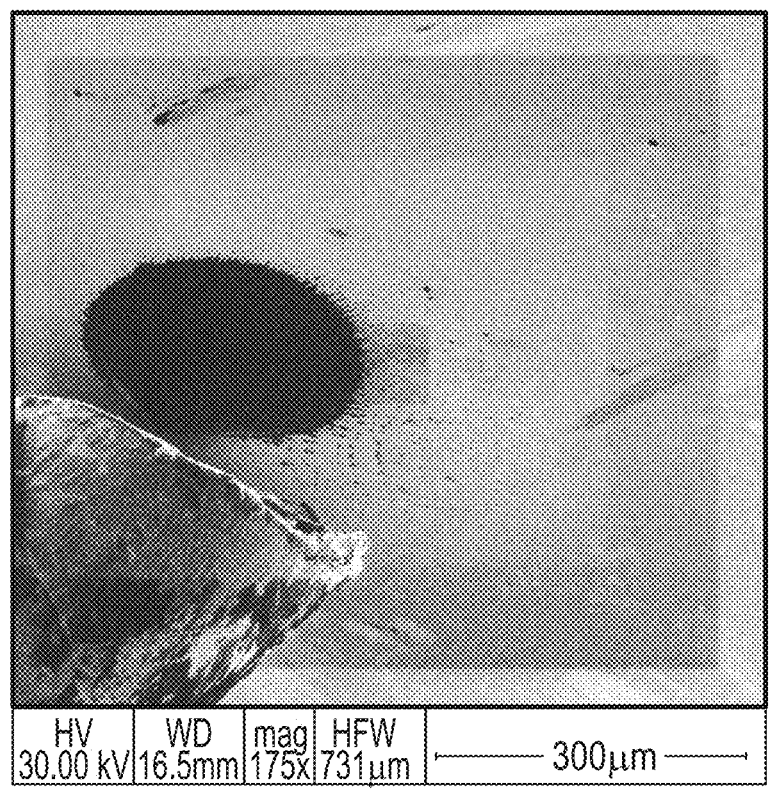
FIG. 7 is a scanning electron microscope image of amorphous carbon deposited on a silicon substrate at cryogenic temperatures in the area of the probe tip with gas injected from the probe assembly.

FIG. 7 is a SEM image of a first exemplary use of the probe system 100, and in particular, to inject water vapor, directionally with use of the gas injection needle 150, onto a substrate at cryogenic temperatures (−160 degrees C.). As shown in FIG. 7, a mound of water ice has formed locally where the injected water vapor has contacted the substrate.

Figure 8:
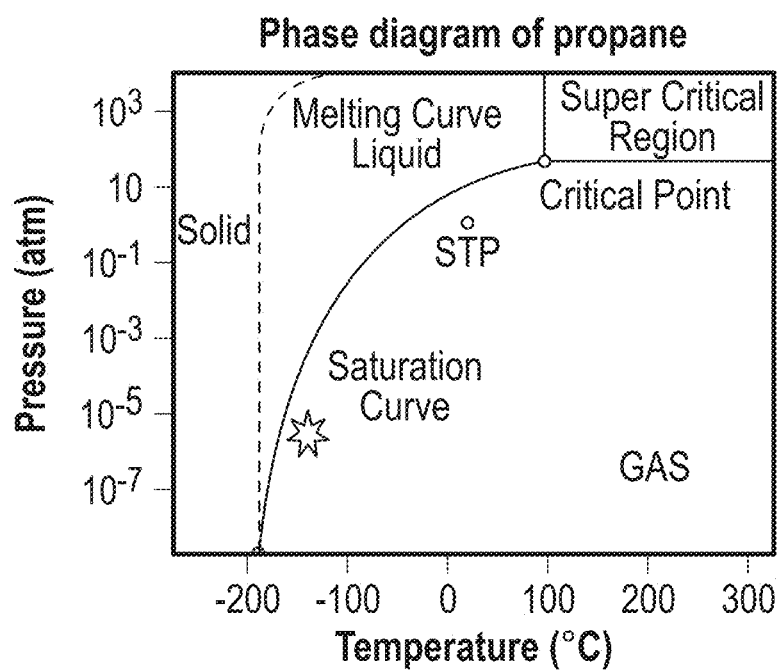
FIG. 8 is a graphical material phase diagram for propane.
Figure 9:
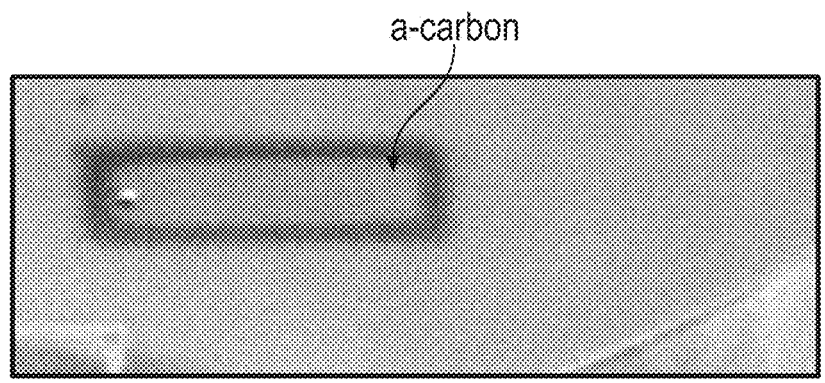
FIG. 9 is a scanning electron microscope image of a carbonaceous material deposited in a pattern on a specimen at cryogenic temperatures with gas injected via the probe system.

In a second exemplary use of the probe system 100, the injected gas is propane. FIG. 8 is a graphical phase diagram for propane showing its properties over a range of pressures and temperatures. Propane is desirable for working in a cryogenic environment because propane remains in a gaseous state, such as even at temperatures of −150 to −160 degrees C. and pressures of $1 \times 10^{-5}$ atm or $1 \times 10^{-6}$ atm. As shown in FIG. 9, injected propane gas has reacted with an ion beam from the charged particle instrument, thereby decomposing into amorphous carbon on a silicon substrate. Specifically, the beam was controlled to move in a rectangular path, and amorphous carbon was deposited along the same path.

Figure 10:
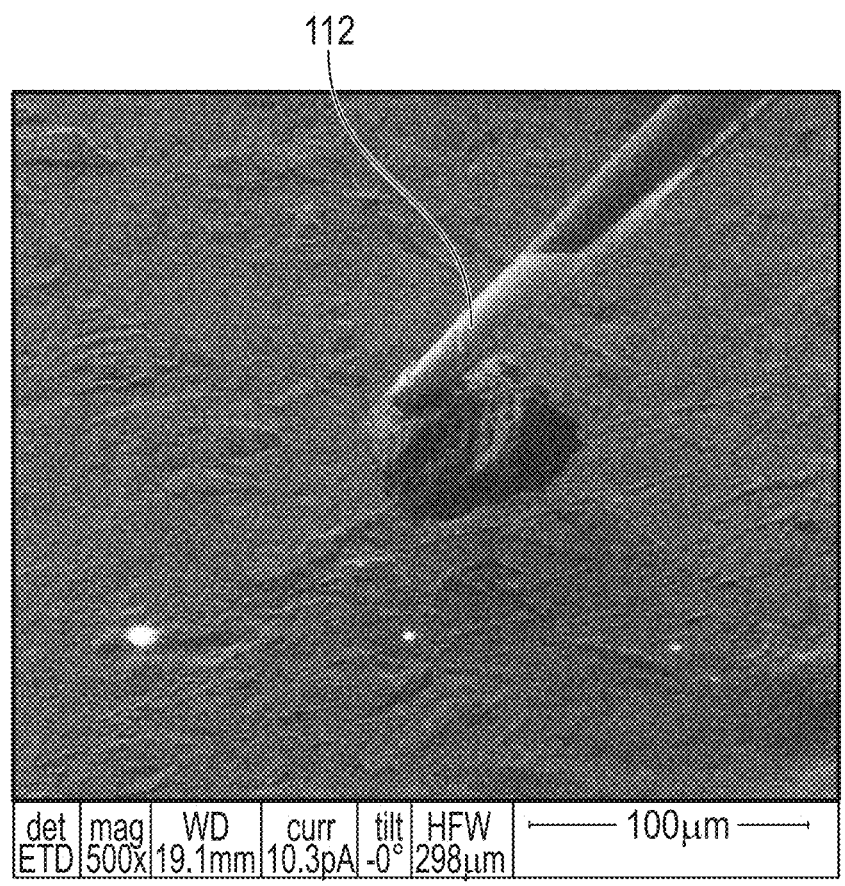
FIG. 10 is a scanning electron microscope image of a particle being welded to the probe needle of the probe system at cryogenic temperatures.

FIG. 10 is a SEM image of the probe needle 112 under high magnification in contact with an exemplary particle within the operating environment. The particle is being "welded" to the tip of the probe needle 112 with amorphous carbon at cryogenic temperatures by injecting propane in the area of the tip. The ion beam is moved in a pattern to overlap the tip and the particle's position on the substrate. When the particle is welded to the tip, it can then be moved, e.g., lifted or otherwise manipulated, using the probe needle.

The probe needle 112 may be made of tungsten. The first tube 120 and the second tube 160 may be made of stainless steel or other suitable materials. The insulator 130 is made of a plastic and serves to thermally insulate the second tube 160 (which houses the gas injection needles 150) from contact with the first tube 120 (which contacts the needle support 116 and houses the thermocouple 200). The fitting 140, support member 194, needle receiving members 196, as well as other components of the positioning assembly 190, can be made of stainless steel or another suitable material.

Figure 11:
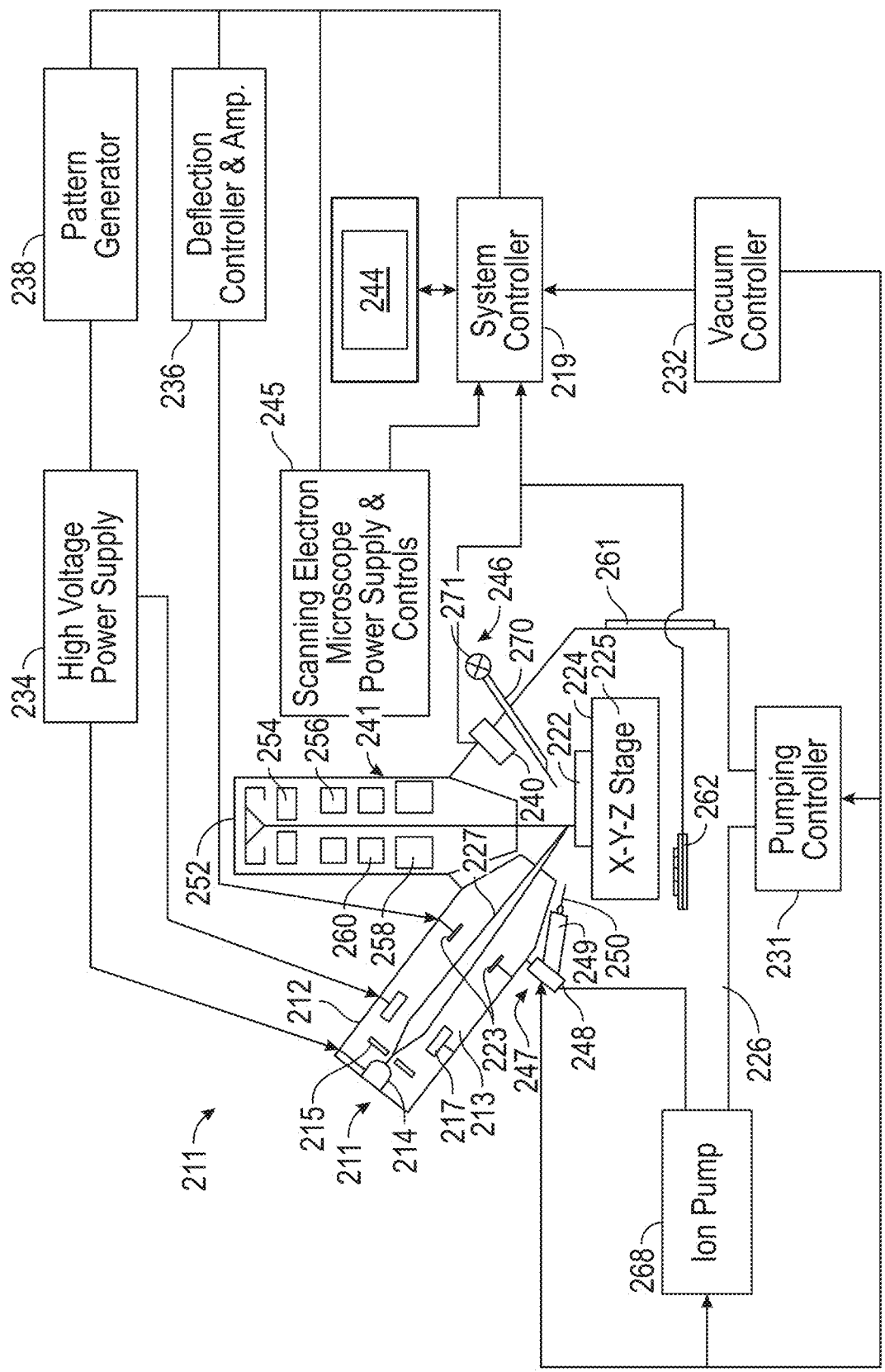
FIG. 11 is a schematic diagram of an exemplary system with which the probe assembly can be used.

FIG. 11 is a schematic diagram showing one representative dual beam SEM/FIB system 211 with which the probe assembly 100 can be used. As discussed above, embodiments of the described apparatus and methods can be used in a wide variety of applications where a material is deposited onto a target surface of a substrate, including the preparation of TEM samples from vitrified biological samples. Suitable dual beam systems are commercially available, for example, from Thermo Fisher Scientific, Hillsboro, Oreg. USA. The following description is an example only and is not limiting.

The dual beam system 211 can have a vertically mounted electron beam column and a focused ion beam (FIB) column mounted at an acute angle from vertical on an evacuable specimen chamber 226. The specimen chamber may be evacuated by, e.g., a turbo-molecular pump, or other suitable pumping devices, such as oil diffusion pumps, ion getter pumps, scroll pumps, etc.

The electron beam column 241 includes an electron source 252 for producing electrons and electron-optical lenses 256, 258 forming a finely focused beam of electrons 243. The beam of electrons 243 can be positioned on and can be scanned over the surface of a substrate 222 by a deflection coil 260. Operation of the lenses 256, 258 and the deflection coil 260 is controlled by a power supply and control unit 245. It is noted that the lenses and deflection unit may use electric fields to manipulate the electron beam, or that magnetic fields may be used, or a combination thereof.

The electron beam 243 can be focused onto the substrate 222, which is on a movable X-Y-Z stage 225 within a lower chamber 226. The stage 225 is cooled so that the sample can be kept at cryogenic temperatures. The cooling may be achieved with a Peltier unit, or for example by a thermal braid connected to a cold source such as a container containing a cryogenic fluid such as liquid nitrogen.

Mounted on the vacuum chamber is a GIS 246. The GIS 246 includes a reservoir (not shown) for holding the precursor material and a needle 270 for directing the precursor material to the surface of the substrate. The GIS further comprises a regulating device 271 for regulating the supply of precursor material to the substrate. In this example, the regulating device 271 is depicted as an adjustable valve, but the device may also take the form of, e.g., controlled heating of the precursor material.

When the electrons in the electron beam strike substrate 222, secondary electrons are emitted. These secondary electrons are detected by secondary electron detector 240, such as an Everhard-Thornley detector, or a semiconductor device capable of detecting low energy electrons. The signal of the detector is fed to a controller 219. Said controller also controls the deflector signals, lenses, electron source, GIS, stage and pump, and other items of the instrument. A monitor 244 is used to display an image of the substrate using the signal of the detector 219. A STEM detector 262, located beneath the TEM sample holder 224 and the stage 225, can collect electrons that are transmitted through a sample mounted on the TEM sample holder.

The dual beam system also includes a focused ion beam (FIB) system 211 which comprises an evacuated chamber having an upper neck portion 212. The axis of a focusing column 213 is tilted at an acute angle from the axis of the electron column. The ion column 212 includes an ion source 214, an extraction electrode 215, a focusing element 217, deflection elements 223, and a focused ion beam 227. The ion beam 227 passes from the ion source 214 through the column 213 and between electrostatic deflection devices schematically indicated at 223 toward substrate 222 positioned on the movable X-Y-Z stage 225 within the lower chamber 226.

The stage 225 can also support one or more TEM sample holders 224 so that a sample can be extracted and moved to a TEM sample holder. The stage 225 can preferably move in a horizontal plane (X and Y axes) and vertically (Z axis). The stage 225 can also tilt approximately 60° and rotate 360° about the Z axis. In some embodiments, a separate TEM sample stage (not shown) can be used. Such a TEM sample stage will also preferably be moveable in the X, Y, and Z axes. A door 261 is opened for inserting the substrate 222 onto X-Y-Z stage 225 and also for servicing an internal gas supply reservoir, if one is used. The door is interlocked so that it cannot be opened if the system is under vacuum.

An ion pump 268 is employed for evacuating the neck portion 212. The chamber 226 is evacuated with turbomolecular and mechanical pumping system 231 under the control of vacuum controller 232. The vacuum system provides within the chamber 226 a vacuum of approximately $3 \times 10^{-6}$ mbar. When a suitable precursor gas is introduced onto the sample surface, the chamber background pressure may rise, typically to about $5 \times 10^{-5}$ mbar.

A high voltage power supply 234 is connected to liquid metal ion source 214 as well as to appropriate electrodes in the ion beam focusing column 213 for forming an approximately 1 key to 60 keV ion beam 227 and directing the same toward a sample. A deflection controller and amplifier 236, operated in accordance with a prescribed pattern provided by pattern generator 238, is coupled to deflection plates 223 whereby ion beam 227 may be controlled manually or automatically to trace out a corresponding pattern on the upper surface of substrate 222. In some systems, the deflection plates are placed before the final lens, as is well known in the art. Beam blanking electrodes (not shown) within the ion beam focusing column 213 cause ion beam 227 to impact onto blanking aperture (not shown) instead of substrate 222 when a blanking controller (not shown) applies a blanking voltage to the blanking electrode.

The liquid metal ion source 214 typically provides a metal ion beam of gallium. The source typically is capable of being focused into a sub one-tenth micrometer wide beam at substrate 222 for either modifying the substrate 222 by ion milling, enhanced etch, material deposition, or for the purpose of imaging the substrate 222.

A nanomanipulator 247, such as the AutoProbe 200™ from Omniprobe, Inc., Dallas, Tex., or the Model MM3A from Kleindiek Nanotechnik, Reutlingen, Germany, can precisely move objects within the vacuum chamber. The nanomanipulator 247 may comprise precision electric motors 248 positioned outside the vacuum chamber to provide X, Y, Z, and theta control of a portion 249 positioned within the vacuum chamber. The nanomanipulator 247 can be fitted with different end effectors for manipulating small objects. In the embodiments described herein, the end effector is a probe needle 250, and the nanomanipulator 247 has the integrated gas injection and position adjustment capability described above for the probe assembly 100. As is known in the prior art, a nanomanipulator (or nanoprobe) can be used to transfer a TEM sample (which has been freed from a substrate, typically by an ion beam) to a TEM sample holder for analysis.

A system controller 219 controls the operations of the various parts of dual beam system 211. Through the system controller 219, a user can cause the ion beam 227 or the electron beam 243 to be scanned in a desired manner through commands entered into a conventional user interface (not shown). Alternatively, the system controller 219 may control dual beam system 211 in accordance with programmed instructions.

The described implementations are applied to beam-induced processing, such as beam-induced deposition. The probe system can be used with electron beams, ion beams, laser beams, cluster beams, and neutral particle beams. Although the examples provided above describe primarily EBID to illustrate the invention, skilled persons can determine from those illustrations how to use the invention with other types of beams, and the invention is not limited to use with electron beams. For example, the invention can be used with an ion beam system having a liquid metal ion source or a plasma ion source. The terms "work piece," "sample," "substrate," and "specimen" are used interchangeably in this application unless otherwise indicated. As used herein, the term "cryogenic temperatures" will be used to refer to temperatures of −50° C. or lower.

In view of the many possible embodiments to which the principles of the disclosed invention may be applied, it should be recognized that the illustrated embodiments are only preferred examples and should not be taken as limiting in scope. Rather, the scope of protection is defined by the following claims. We therefore claim all that comes within the scope and spirit of these claims.

We claim:

1. A probe assembly for use with a charged particle instrument, comprising:
    an elongate body having a proximal end for positioning outside of a charged particle instrument enclosed environment, a distal end for positioning within the enclosed environment and a longitudinal axis;
    a port interface located on the body between the proximal and distal ends, the port interface being coupleabie to a nanomanipulator system of the charged particle instrument;
    a probe needle positioned at a distal end of the body, wherein the probe needle is selectively positionable from outside the enclosed environment to contact a specimen within the enclosed environment; and
    at least a first gas injection needle and a second gas injection needle extending through a common tubular section of the elongate body and adjustably positioned near to the probe needle, the first and second gas injection needles having generally opposing distal ends positioned on opposite sides of the probe needle, the first and second gas injection needles being respectively connectable to one or more sources of pressurized gas and independently controllable to selectively inject gas in the area of the probe needle within the enclosed environment.

2. The probe assembly of claim 1, wherein the each of the first gas injection needle and the second gas injection needle is positionable, respectively, within 0.5 mm to 5 mm of the probe needle.

3. The probe assembly of claim 1, further comprising at least first and second needle receiving members that are selectively movable to reposition the respective distal ends of the first and second gas injection needles relative to the probe needle.

4. The probe assembly of claim 3, further comprising a positioning member that supports the first and second needle receiving members, wherein the positioning member is movable in a first transverse direction extending transverse to the longitudinal axis to move the at least two needle receiving members in tandem relative to the probe needle.

5. The probe assembly of claim 4, wherein the needle receiving members are separately movable relative to the probe needle in a second transverse direction perpendicular to the longitudinal axis and to the first transverse direction to reposition the respective distal ends of the first and second gas injection needles relative to the needle probe and to each other.

6. The probe assembly of claim 1, wherein the body comprises a temperature sensor positioned to sense an approximate temperature of the probe needle during operation in the enclosed environment.

7. A probe assembly for use with a charged particle instrument, comprising:
    an elongate body having a proximal end for positioning outside of a charged particle instrument enclosed environment, a distal end for positioning within the enclosed environment and a longitudinal axis;
    a port interface located on the body between the proximal and distal ends, the port interface being coupleable to a nanomanipulator system of the charged particle instrument;
    a probe needle positioned at a distal end of the body, wherein the probe needle is selectively positionable from outside the enclosed environment to contact a specimen within the enclosed environment; and
    at least one gas injection needle extending through a tubular section of the elongate body and adjustably positioned near to the probe needle, the at least one gas injection needle being connectable to a source of pressurized gas to selectively inject gas in the area of the probe needle within the enclosed environment,
    wherein the body comprises a needle support to which the probe needle is removably coupled, a first tube coupled to the needle support and extending proximally, a spacer coupled to the first tube and extending proximally, and a second tube coupled to the spacer and extending proximally, further comprising at least one temperature sensor positioned adjacent a location where the first tube and the needle support are coupled together and having one or more signal lines extending proximally through the first tube.

8. The probe assembly of claim 7, wherein the temperature assembly comprises a thermocouple, and wherein the thermocouple wires are hermetically sealed in place near a proximal end of the probe assembly, and wherein the needle support has a recess shaped to receive the distal end of the first tube.

9. The probe assembly of claim 7, wherein the needle support has a connection for a wire braid connection to a source of cryogenic cooling for keeping the probe needle at cryogenic temperatures.

10. The probe assembly of claim 7, wherein the at least one gas injection needle is a first gas injection needle, further comprising a second gas injection needle, wherein the spacer has at least two passages that are opposed to each other, and wherein the passages are configured to receive the first and second gas injection needles from the second tube and to support the exposed distal ends of the first and second gas injection needles in positions spaced away from each other, the needle support and the probe needle.

11. The probe assembly of claim 1, further comprising a sheath configured to slide over the first and second gas injection needles and a distal end of the body to constrain the first and second gas injection needles for inserting the body into the instrument.

12. A method of using a port-mounted nanomanipulator system in a charged particle instrument, comprising:
providing a combined probe and gas injection assembly, the assembly having an elongate body, a proximal end, a distal end with a probe needle and a port interface positioned between the distal end and the proximal end, wherein the elongate body comprises a tubular section;
providing first and second gas infection needles extending through the tubular section of the elongate body and supported on a positioning device adjacent the probe needle;
coupling the port interface on the elongate body to a port of the system, wherein a portion of the probe extending distally from the port interface is within an enclosed instrument environment;
connecting the proximal end to one or more sources of pressurized gas to allow gas to be selectively injected through the first gas injection needle and/or the second gas injection needle and independently controllable to cause gas to flow into the instrument environment in the area of the probe needle.

13. The method of claim 12, further comprising adjusting a position of at least one of the first and second gas injection needles relative to the probe needle.

14. The method of claim 13, further comprising using a positioning device to adjust a position of at least one of the first gas injection needle and the second gas injection needle relative to the probe needle along a first direction transverse to the longitudinal axis.

15. The method of claim 14, further comprising using the positioning device to adjust the position of the first gas injection needle and the second gas injection needle relative to the probe needle along a second direction perpendicular to the longitudinal axis and the first direction.

16. The method of claim 12, further comprising positioning a distal end of the first gas injection needle or the second gas injection needle within 0.5 mm to 5 mm of the probe needle.

* * * * *